US009705078B2

(12) United States Patent
Liu et al.

(10) Patent No.: US 9,705,078 B2
(45) Date of Patent: *Jul. 11, 2017

(54) INTEGRATED CIRCUITRY COMPRISING NONVOLATILE MEMORY CELLS AND METHODS OF FORMING A NONVOLATILE MEMORY CELL

(71) Applicant: Micron Technology, Inc., Boise, ID (US)

(72) Inventors: Jun Liu, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/981,198

(22) Filed: Dec. 28, 2015

(65) Prior Publication Data
US 2016/0133835 A1  May 12, 2016

Related U.S. Application Data

(60) Continuation of application No. 14/525,659, filed on Oct. 28, 2014, now Pat. No. 9,245,964, which is a
(Continued)

(51) Int. Cl.
*H01L 45/00* (2006.01)
*H01L 27/24* (2006.01)
(Continued)

(52) U.S. Cl.
CPC .... *H01L 45/1266* (2013.01); *H01L 21/28114* (2013.01); *H01L 27/2436* (2013.01);
(Continued)

(58) Field of Classification Search
None
See application file for complete search history.

(56) References Cited

U.S. PATENT DOCUMENTS

| 4,715,685 A | 12/1987 | Yaniv et al. |
| 6,552,952 B2 | 4/2003 | Pascucci |
| (Continued) | | |

FOREIGN PATENT DOCUMENTS

| CN | 1444284 | 9/2003 |
| CN | 1459792 | 12/2003 |
| (Continued) | | |

OTHER PUBLICATIONS

Hosoi et al., High Speed Unipolar Switching Resistance RAM (RRAM) Technology, IEEE International Electron Devices Meeting, Dec. 2006, 4 p.
(Continued)

*Primary Examiner* — Khaja Ahmad
(74) *Attorney, Agent, or Firm* — Wells St. John, P.S.

(57) ABSTRACT

An integrated circuit has a nonvolatile memory cell that includes a first electrode, a second electrode, and an ion conductive material there-between. At least one of the first and second electrodes has an electrochemically active surface received directly against the ion conductive material. The second electrode is elevationally outward of the first electrode. The first electrode extends laterally in a first direction and the ion conductive material extends in a second direction different from and intersecting the first direction. The first electrode is received directly against the ion conductive material only where the first and second directions intersect. Other embodiments, including method embodiments, are disclosed.

19 Claims, 7 Drawing Sheets

Related U.S. Application Data continuation of application No. 14/066,805, filed on Oct. 30, 2013, now Pat. No. 8,883,604, which is a division of application No. 12/909,650, filed on Oct. 21, 2010, now Pat. No. 8,759,809.

(51) Int. Cl.
*H01L 21/28* (2006.01)
*H01L 29/423* (2006.01)
*H01L 29/66* (2006.01)

(52) U.S. Cl.
CPC ...... *H01L 27/2463* (2013.01); *H01L 27/2472* (2013.01); *H01L 27/2481* (2013.01); *H01L 29/4236* (2013.01); *H01L 29/42376* (2013.01); *H01L 29/6656* (2013.01); *H01L 29/66621* (2013.01); *H01L 45/085* (2013.01); *H01L 45/124* (2013.01); *H01L 45/1233* (2013.01); *H01L 45/142* (2013.01); *H01L 45/143* (2013.01); *H01L 45/144* (2013.01); *H01L 45/146* (2013.01); *H01L 45/1691* (2013.01)

(56) References Cited

U.S. PATENT DOCUMENTS

| | | |
|---|---|---|
| 6,687,147 B2 | 2/2004 | Frickie et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,757,188 B2 | 6/2004 | Perner et al. |
| 6,778,421 B2 | 8/2004 | Tran |
| 6,834,008 B2 | 12/2004 | Rinerson et al. |
| 6,873,544 B2 | 3/2005 | Perner et al. |
| 6,946,702 B2 | 9/2005 | Jang |
| 6,961,258 B2 | 11/2005 | Lowrey |
| 7,009,278 B2 | 3/2006 | Hsu |
| 7,026,911 B2 | 4/2006 | Aono et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,085,167 B2 | 8/2006 | Lee et al. |
| 7,098,438 B1 | 8/2006 | Frazier |
| 7,123,535 B2 | 10/2006 | Kurotsuchi et al. |
| 7,193,267 B2 | 3/2007 | Hsu et al. |
| 7,236,389 B2 | 6/2007 | Hsu |
| 7,388,775 B2 | 6/2008 | Bedeschi et al. |
| 7,459,715 B2 | 12/2008 | Toda et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,570,511 B2 | 8/2009 | Cho et al. |
| 7,772,580 B2 | 8/2010 | Hofmann et al. |
| 7,864,568 B2 | 1/2011 | Fujisaki et al. |
| 7,910,909 B2 | 3/2011 | Kim et al. |
| 7,952,914 B2 | 5/2011 | Baek et al. |
| 8,094,477 B2 | 1/2012 | Maejima |
| 8,124,968 B2 | 2/2012 | Koo et al. |
| 8,295,077 B2 | 10/2012 | Murooka |
| 8,355,274 B2 | 1/2013 | Arita et al. |
| 8,537,592 B2 | 9/2013 | Liu |
| 8,854,863 B2 | 10/2014 | Liu |
| 2002/0018355 A1 | 2/2002 | Johnson et al. |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0223283 A1 | 12/2003 | Kunikiyo |
| 2004/0090841 A1 | 5/2004 | Perner et al. |
| 2004/0100835 A1 | 5/2004 | Sugibayashi et al. |
| 2004/0188714 A1 | 9/2004 | Scheuerlein et al. |
| 2004/0245547 A1 | 12/2004 | Stipe |
| 2005/0001257 A1 | 1/2005 | Schoelsser et al. |
| 2005/0014325 A1 | 1/2005 | Aono et al. |
| 2005/0128799 A1 | 6/2005 | Kurotsuchi et al. |
| 2005/0161747 A1 | 7/2005 | Lung et al. |
| 2005/0180248 A1 | 8/2005 | Scheuerlein |
| 2005/0205943 A1 | 9/2005 | Yamada |
| 2005/0243844 A1 | 11/2005 | Aono et al. |
| 2005/0250281 A1 | 11/2005 | Ufert et al. |
| 2006/0023498 A1 | 2/2006 | Asao |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0181920 A1 | 8/2006 | Ufert |
| 2006/0274593 A1 | 12/2006 | Kurotsuchi et al. |
| 2006/0284157 A1* | 12/2006 | Chen ..................... H01L 45/06 257/2 |
| 2006/0286709 A1 | 12/2006 | Lung et al. |
| 2007/0015330 A1 | 1/2007 | Li et al. |
| 2007/0086235 A1 | 4/2007 | Kim et al. |
| 2007/0120124 A1 | 5/2007 | Chen et al. |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0176261 A1* | 8/2007 | Lung ................. H01L 27/2436 257/536 |
| 2007/0210348 A1 | 9/2007 | Song et al. |
| 2007/0268742 A1 | 11/2007 | Liu |
| 2007/0278578 A1 | 12/2007 | Yoshida et al. |
| 2007/0285965 A1 | 12/2007 | Toda et al. |
| 2008/0001172 A1 | 1/2008 | Karg et al. |
| 2008/0008642 A1 | 1/2008 | Mori et al. |
| 2008/0029842 A1 | 2/2008 | Symanczyk |
| 2008/0036508 A1 | 2/2008 | Sakamoto et al. |
| 2008/0078985 A1 | 4/2008 | Meyer et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0175032 A1 | 7/2008 | Tanaka et al. |
| 2008/0251779 A1 | 10/2008 | Kakoschke et al. |
| 2008/0258126 A1 | 10/2008 | Lung |
| 2008/0303014 A1 | 12/2008 | Goux et al. |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0141547 A1 | 6/2009 | Jin et al. |
| 2009/0173930 A1 | 7/2009 | Yasuda et al. |
| 2009/0207681 A1 | 8/2009 | Juengling et al. |
| 2009/0218557 A1 | 9/2009 | Sato |
| 2009/0218558 A1 | 9/2009 | Park et al. |
| 2009/0261314 A1 | 10/2009 | Kim et al. |
| 2009/0267047 A1 | 10/2009 | Sasago et al. |
| 2009/0268532 A1 | 10/2009 | DeAmbroggi et al. |
| 2010/0008163 A1 | 1/2010 | Liu |
| 2010/0046273 A1 | 2/2010 | Azuma et al. |
| 2010/0061132 A1 | 3/2010 | Fujisaki et al. |
| 2010/0065836 A1 | 3/2010 | Lee et al. |
| 2010/0072452 A1 | 3/2010 | Kim et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0176368 A1 | 7/2010 | Ko et al. |
| 2010/0178729 A1 | 7/2010 | Yoon et al. |
| 2010/0193758 A1* | 8/2010 | Tian ..................... B82Y 10/00 257/2 |
| 2010/0193761 A1 | 8/2010 | Amin et al. |
| 2010/0195371 A1 | 8/2010 | Ohba et al. |

(56) References Cited

U.S. PATENT DOCUMENTS

| | | |
|---|---|---|
| 2010/0232200 A1 | 9/2010 | Shepard |
| 2010/0259960 A1 | 10/2010 | Samachisa |
| 2010/0259961 A1 | 10/2010 | Fasoli et al. |
| 2010/0259962 A1 | 10/2010 | Yan et al. |
| 2011/0261606 A1 | 10/2011 | Sandhu et al. |
| 2011/0261607 A1 | 10/2011 | Tang et al. |
| 2012/0147648 A1 | 6/2012 | Scheuerlein |
| 2012/0248399 A1 | 10/2012 | Sasago et al. |
| 2013/0021836 A1 | 1/2013 | Liu |
| 2014/0247640 A1 | 9/2014 | Liu |

FOREIGN PATENT DOCUMENTS

| | | |
|---|---|---|
| CN | 1624803 | 6/2005 |
| CN | 101256831 | 9/2008 |
| CN | 201180027954.6 | 5/2014 |
| EP | GB 1266513 | 3/1972 |
| EP | 0117045 | 8/1984 |
| EP | 11792836 | 12/2013 |
| EP | 11834802 | 3/2015 |
| EP | 14171745 | 3/2015 |
| EP | 14171745.4 | 12/2016 |
| JP | 2006032729 | 2/2006 |
| JP | 2006074028 | 3/2006 |
| KR | 10-2003-0048421 | 6/2003 |
| KR | 10-0751736 | 8/2007 |
| KR | 20090109804 | 10/2009 |
| KR | 20100083402 | 7/2010 |
| TW | 097147549 | 5/2013 |
| TW | 100119681 | 8/2013 |
| TW | 100135681 | 10/2013 |
| TW | 101102280 | 8/2014 |
| WO | PCT/US2008/084422 | 3/2009 |
| WO | WO 2010/068221 | 6/2010 |
| WO | PCT/US2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | PCT/US2011/035601 | 11/2011 |
| WO | PCT/US2011/051785 | 4/2012 |
| WO | PCT/US2011/066770 | 9/2012 |
| WO | PCT/US2011/035601 | 12/2012 |
| WO | PCT/US2011/051785 | 4/2013 |
| WO | PCT/US2011/066770 | 7/2013 |

OTHER PUBLICATIONS

Hudgens et al., "Overview of Phase-Change Chalcogenide Non-volatile Memory Technology", MRS Bulletin, Nov. 2004, pp. 829-832.

Ignatiev et al., "Resistance Non-volatile Memory-RRAM", Mater. Res. Soc. Symp. Proc., vol. 997, 2007 Materials Research Society, 9 pages.

Kau et al., "A Stackable cross point phase change memory", IEEE, 2009, pp. 27.1.1-27.1.4.

Kozicki, "Memory Devices Based on Solid Electrolytes", Mater. Res. Soc. Symp. Proc., vol. 997, 2007, Materials Research Society, 10 pages.

Lee et al., "Resistance Switching of Al Doped ZnO for Non Volatile Memory Applications", IEEE 21st. Non-Volatile Semiconductor Memory Workshop, 2006, 2 pp.

Meyer et al., "Oxide Dual-Layer Memory Element for Scalable Non-Volatile Cross-Point Memory Technology", IEEE, 2008, 5 pages.

Oh, "Full Integration of Highly Manufacturable 512Mb PRAM based on 90nm Technology" 2006, IEEE, 4 pages.

Wuttig, "Towards a Universal Memory?", Nature Materials, vol. 4, Apr. 2005, pp. 265-266.

Yoon et al., "Vertical Cross-Point Resistance Change Memory for Ultra-High Density Non-volatile Memory Applications", 2009 Symposium on VLSI Technology Digest of Technical Papers, pp. 26-27.

\* cited by examiner

INTEGRATED CIRCUITRY COMPRISING NONVOLATILE MEMORY CELLS AND METHODS OF FORMING A NONVOLATILE MEMORY CELL

RELATED PATENT DATA

This patent resulted from a divisional application of U.S. patent application Ser. No. 14/525,659, filed Oct. 28, 2014, entitled "Integrated Circuitry Comprising Nonvolatile Memory Cells And Methods Of Forming A Nonvolatile Memory Cell", naming Jun Liu and John K. Zahurak as inventors, which is a continuation application of U.S. patent application Ser. No. 14/066,805, filed Oct. 30, 2013, now U.S. Pat. No. 8,883,604 entitled "Integrated Circuitry Comprising Nonvolatile Memory Cells And Methods Of Forming A Nonvolatile Memory Cell", naming Jun Liu and John K. Zahurak as inventors, which is a divisional application of U.S. patent application Ser. No. 12/909,650, filed Oct. 21, 2010, now U.S. Pat. No. 8,759,809 B2, entitled "Integrated Circuitry Comprising Nonvolatile Memory Cells And Methods Of Forming A Nonvolatile Memory Cell", naming Jun Liu and John K. Zahurak as inventors, the disclosures of which are incorporated by reference.

TECHNICAL FIELD

Embodiments disclosed herein pertain to memory cells of integrated circuitry, and to methods of forming memory cells.

BACKGROUND

Memory is one type of integrated circuitry, and is used in computer systems for storing data. Such is usually fabricated in one or more arrays of individual memory cells. The memory cells might be volatile, semivolatile, or nonvolatile. Nonvolatile memory cells can store data for extended periods of time, in many instances including when the computer is turned off. Volatile memory dissipates and therefore requires to be refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

One example memory device is a programmable metallization cell (PMC). Such may be alternatively referred to as conductive bridging RAM (CBRAM), nanobridge memory, or electrolyte memory. A PMC uses ion conductive material (for instance, a suitable chalcogenide or any of various suitable oxides) sandwiched between a pair of electrodes. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figure 1:
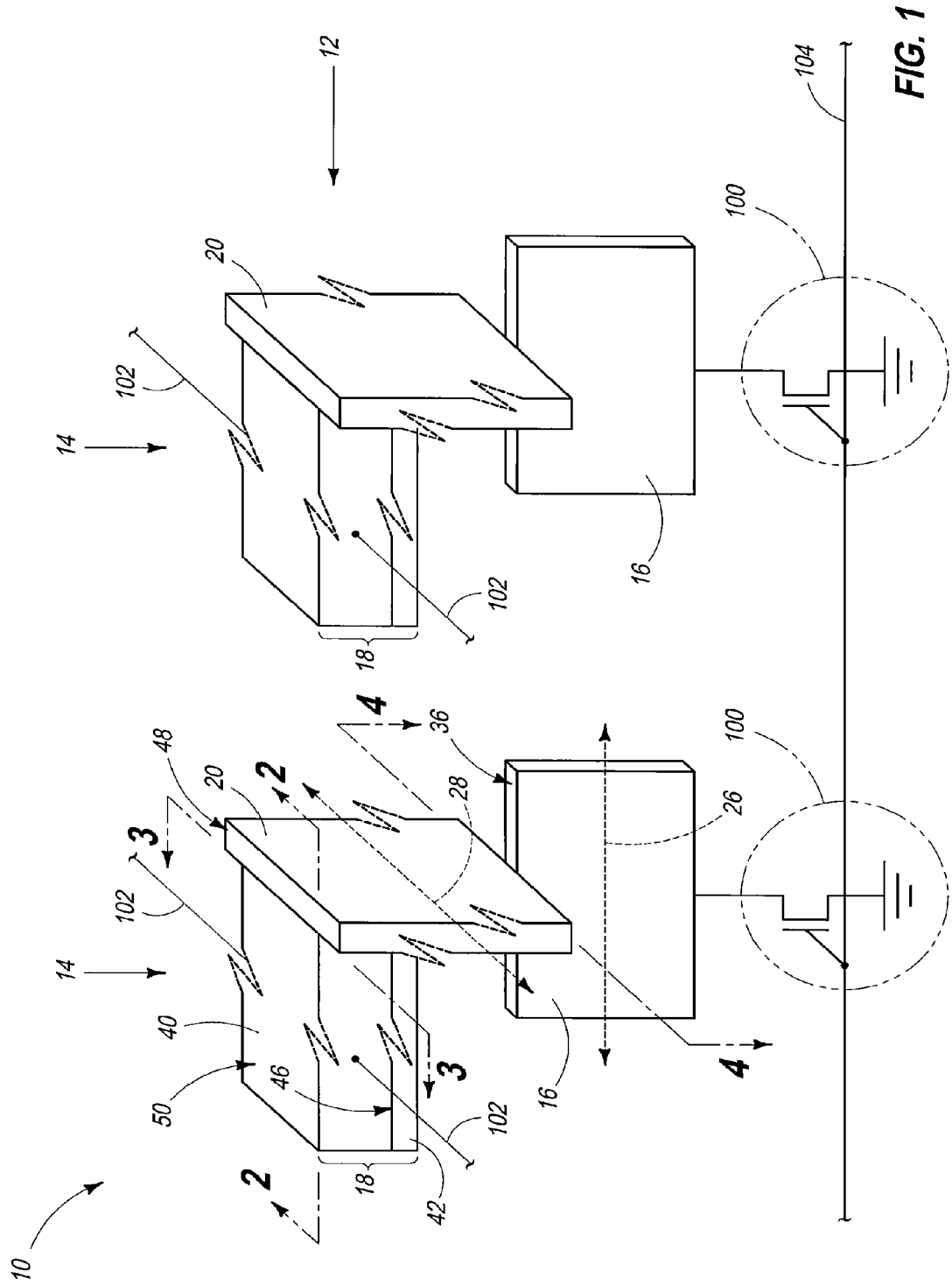
FIG. 1 is a hybrid schematic and fragmentary structural view of a portion of an integrated circuit in accordance with an embodiment of the invention.

Embodiments of the invention encompass integrated circuitry comprising a nonvolatile memory cell, and methods of forming a nonvolatile memory cell. Referring initially to FIGS. 1-4, an example integrated circuit 10 comprises a plurality of nonvolatile memory cells 14 formed within a memory array 12. An individual memory cell 14 comprises a first current conductive electrode 16, a second current conductive electrode 18 formed elevationally outward thereof, and an ion conductive material 20 received between such electrodes. A material 22, which may be homogenous or non-homogenous, may surround components 16, 18 and 20. Material 22 is not shown in FIG. 1 for clarity in depicting the operable components. Material 22 would likely be insulative at least where contacting components 16, 18, and 20 in the figures, with doped silicon dioxide being an example.

Components 16, 18, 20 and material 22 may be fabricated relative to or supported by a suitable base substrate (not shown), for example a semiconductor substrate which may comprise monocrystalline silicon and/or other semiconductive material. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Electrodes 16 and 18 may comprise any suitable current conductive material, and may be homogenous or non-homogenous. In the context of this document, "current conductive material" is a composition where electric current flow would inherently occur therein predominantly by movement of subatomic positive and/or negative charges when such are generated as opposed to predominantly by movement of ions. At least one of first electrode 16 and second electrode 18 has an electrochemically active surface received directly against ion conductive material 20. In this document, a material or structure is "directly against" another when there is at least some physical touching contact of the stated materials or structures relative one another. In contrast, "over" encompasses "directly against" as well as constructions where intervening material(s) or structure(s) result in no physical touching contact of the stated materials or structures relative one another. By way of examples only, suitable current conductive and electrochemically active materials include copper, silver, and alloys including at least one of copper and silver. Example suitable current conductive and electrochemically inactive materials include titanium nitride, gold, tungsten, platinum, and alloys including at least one of gold, tungsten or platinum.

Ion conductive material 20 may be a solid, gel, or any other suitable phase, and may be homogenous or non-homogenous. Example suitable materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, silicon oxide (specifically, silicon dioxide), gadolinium oxide, etc. Such may have silver ions or other suitable ions diffused therein for ionic conduction, analogously to structures disclosed in U.S. Pat. No. 7,405,967 and U.S. Patent Publication Number 2010/0193758.

In one embodiment, second electrode 18 may be considered as having a lateral outermost sidewall 21 (FIGS. 2 and 3) and ion conductive material 20 may be considered as having a transverse outermost sidewall 24 (FIG. 2) received directly against such second electrode sidewall 21. In one embodiment, such may be vertically oriented at least where each is directly received against the other. In this document, vertical is a direction generally orthogonal to a primary surface relative to which the substrate is processed during fabrication and which may be considered to define a generally horizontal direction. Further, "vertical" and "horizontal" as used herein are general perpendicular directions relative one another independent of orientation of the substrate in three dimensional space. Further in this document, "elevationally outward" is with reference to the vertical direction from a base substrate upon which the circuitry is fabricated.

In one embodiment, first electrode 16 may extend laterally in a first direction 26 and ion conductive material 20 may extend laterally in a second direction 28 different from and intersecting first direction 26. Accordingly, such angle relative to one another, with reference to "angle" herein meaning any angle other than the straight angle. In one embodiment, first and second directions 26, 28 intersect at an angle from about 45° to 90°, and in one embodiment from 80° to 90°. Such are shown in FIGS. 1-4 as intersecting at a 90° angle 29 (FIG. 4), as an example. First direction 26 and direction 28 may be parallel to the horizontal direction.

Figure 4:
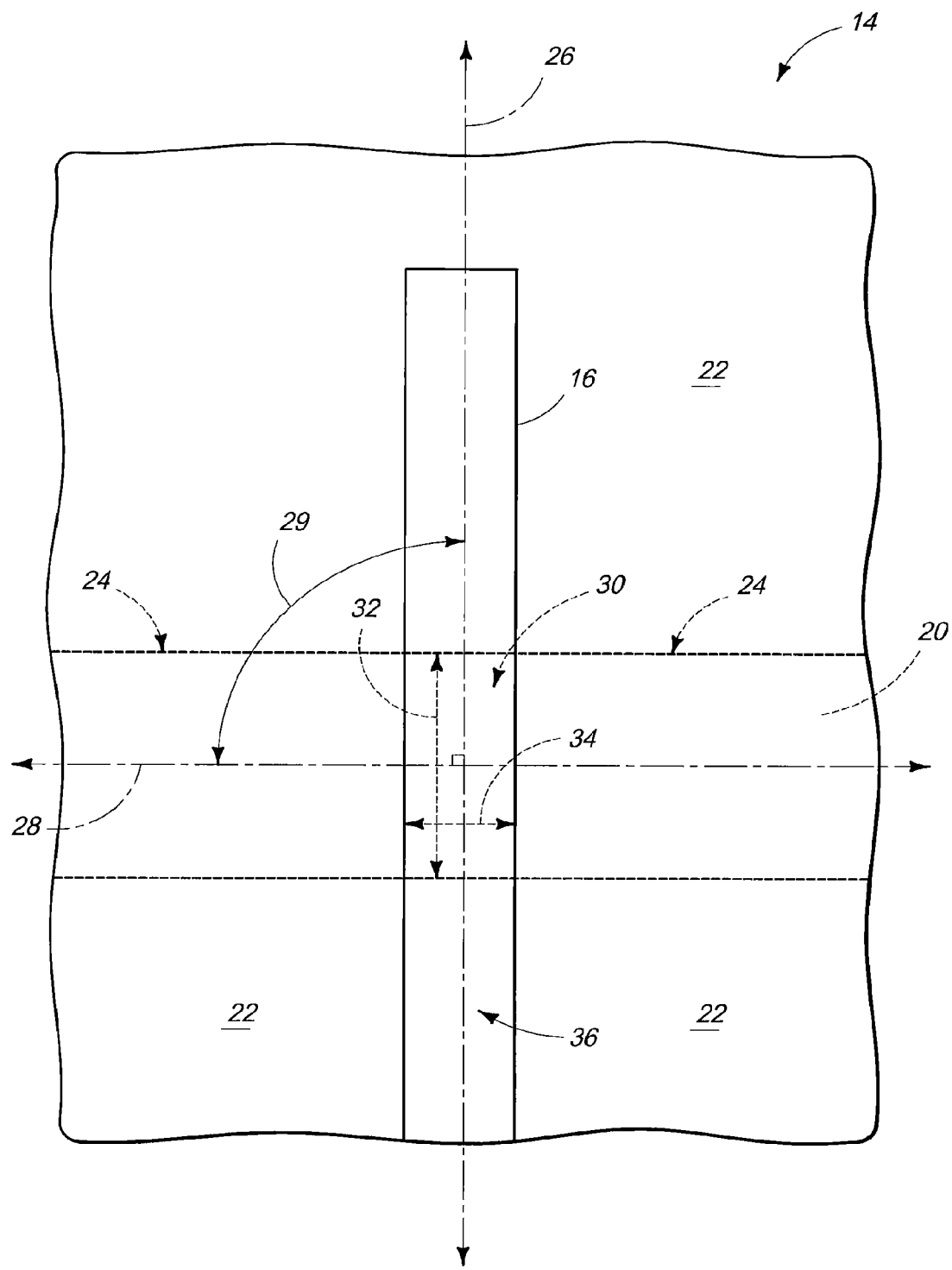
FIG. 4 is a sectional view of a portion of FIG. 1 taken through line 4-4 in FIG. 1.

Regardless and referring to FIG. 4, in one embodiment ion conductive material 20 and first electrode 16 may be considered as contacting one another at a maximum contacting area 30. Such is defined by a transverse thickness 32 of ion conductive material 20 and a transverse thickness 34 of first electrode 16 where such cross at angle 29 of intersecting directions 26 and 28. Such may provide an advantage of more precisely defining a position from where a conduction channel through material 20 will initiate upon programming to a low resistance state. Such may also provide an advantage of assuring formation of only a single conduction channel, where such is desired. In one embodiment, at least one of first electrode 16 and ion conductive material 20 has its respective transverse thickness where such cross which is less than F, where F is a minimum feature dimension of lithographically-defined features of the substrate (meaning the minimum of all feature dimensions which are defined lithographically). Regardless, an example thickness range 32 for ion conductive material 20 is from about 2 to 30 nanometers, while that for first electrode 16 is from about 2 to 20 nanometers (thickness 34). In one embodiment, each of the first electrode 16 and ion conductive material 20 has a respective uniform transverse thickness which may be the same or different from each other, with different thicknesses being shown.

First electrode 16 may be considered as having an elevationally outer surface 36 with, in one embodiment, at least a portion thereof being received directly against ion conductive material 20. Analogously, second electrode sidewall 21 may be considered as comprising a surface received directly against ion conductive material 20. At least a portion of at least one of sidewall 21 or surface 36 as received directly against ion conductive material 20 is electrochemically active. Accordingly, second electrode 18 and/or first electrode 16 has some electrochemically active surface received directly against ion conductive material 20.

In one embodiment, at least second electrode 18 comprises an electrochemically active surface. By way of example, second electrode 18 is shown as comprising a composite of current conductive material 40 and current conductive material 42, with material 42 in one embodiment also constituting an electrochemically active material having a surface 21 which is received directly against ion conductive material 20. Material 40 and material 42 may, respectively, be homogenous or non-homogenous. An example thickness range for current conductive and electrochemically active material 42 is from about 2 to 30 nanometers, while that for current conductive material 40 is from about 10 to 80 nanometers. Current conductive material 40 may or may not also be electrochemically active, and in one embodiment is electrochemically inactive, for example comprising elemental tungsten. In one embodiment, the current conductive material of first electrode 16 may be electrochemically inactive, again with elemental tungsten being one specific example.

Within array 12, material 42 and/or material 40 may extend/run continuously in individual of the column/row lines, or first electrode 16 may run continuously in individual of the column/row lines. Regardless, ion conductive material 20 may extend/run continuously in a line, may be continuous throughout the array, or may be patterned with defined edges for individual of the memory cells. As an example only, FIGS. 1-4 show material 40 and ion conductive material 20 extending along or as respective continuous lines, with material 42 and first electrode 16 being isolated structures for each memory cell 14.

In one embodiment where at least the second electrode comprises an electrochemically active material having a surface directly against ion conductive material, the ion conductive material has an elevationally outermost surface which is elevationally outward of an elevationally outermost surface of the electrochemically active material. For example in the embodiment of FIGS. 1-4, electrochemically active material 42 may be considered as having an elevationally outermost surface 46 and ion conductive material 20 may be considered as having an elevationally outermost surface 48. Surface 48 is elevationally outward of surface 46. In one embodiment, the second electrode may comprise an electrochemically inactive material which is received elevationally outward of the electrochemically active material of the second electrode. The electrochemically inactive material comprises an elevationally outermost surface which is elevationally coincident with the elevationally outermost surface of the ion conductive material. For example in the embodiment of FIGS. 1-4 where material 42 is electrochemically active and material 40 is electrochemically inactive, material 40 comprises an elevationally outermost surface 50 which is elevationally coincident with surface 48 of ion conductive material 20.

Figure 5:
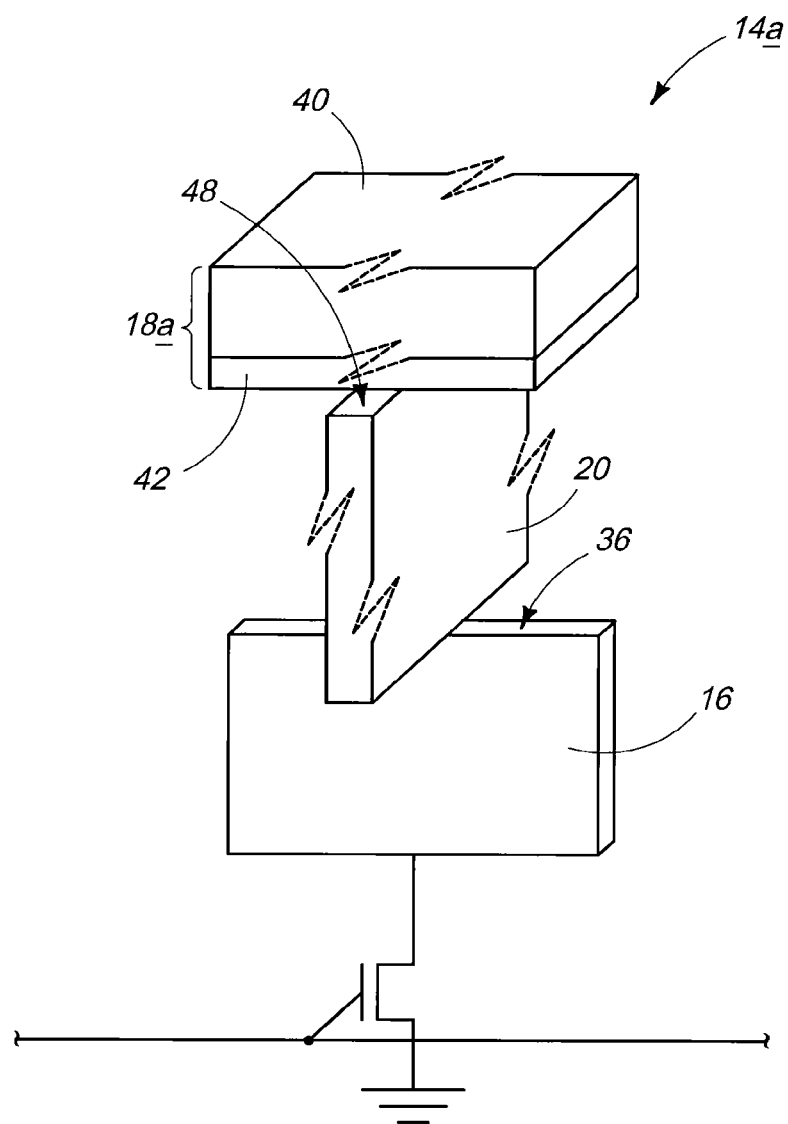
FIG. 5 is a hybrid schematic and fragmentary structural view of a portion of an alternate embodiment integrated circuit in accordance with an aspect of the invention.

In one embodiment, each of the first electrode, the second electrode, and the ion conductive material is platelike and oriented perpendicularly relative each other. In the context of this document, "platelike" defines a construction having length and width dimensions which are each at least 2.5 times greater than a maximum transverse thickness/depth of the construction orthogonal to the length and width. FIG. 1 depicts such a construction where each of electrodes 16, 18 and ion conductive material 20 is platelike (having edge surfaces) and perpendicularly oriented relative to each other. Any other attribute may apply as described above. By way of example, the second platelike electrode may comprise an electrochemically active surface received directly against the platelike ion conductive material. Further as an example, the platelike ion conductive material may comprise an elevationally outermost surface having the second electrode received directly there-against, for example as shown in the embodiment of FIG. 5. The electrodes and ion conductive material of the embodiments of FIGS. 1 and 5 may be considered respectively as being platelike in a volume expanse encompassing an individual memory cell 14/14a even if one or more of such extends or runs continuously in an individual line or is otherwise continuous in some aspect other than shown.

Figure 2:
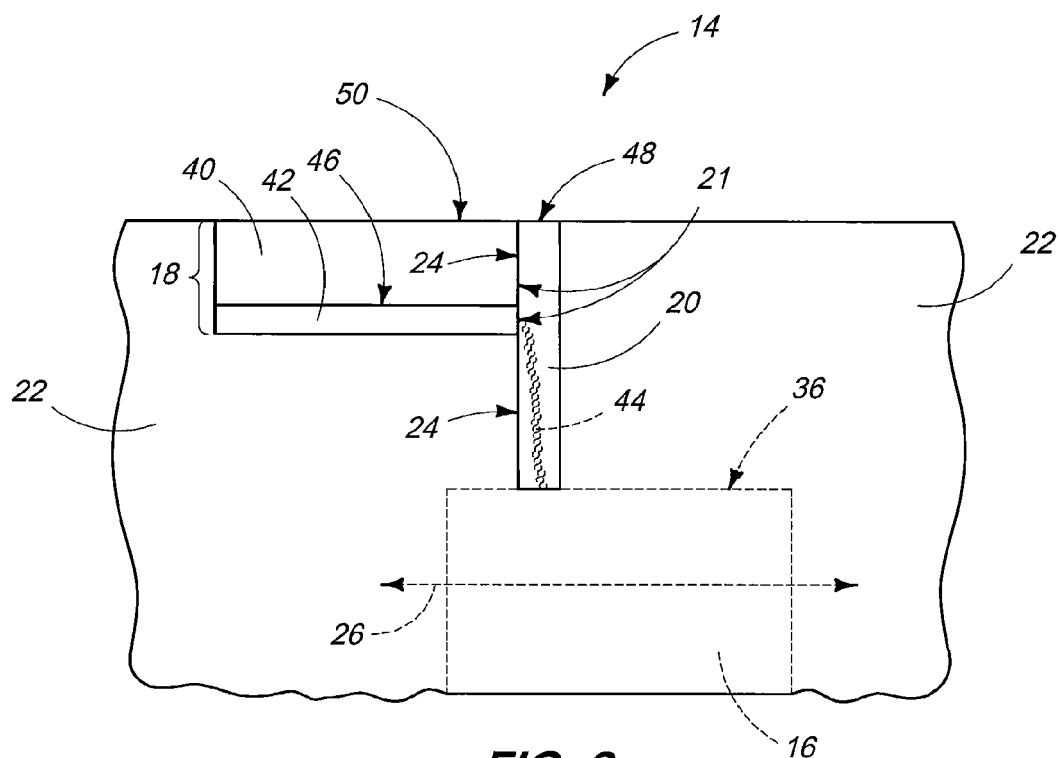
FIG. 2 is a sectional view of a portion of FIG. 1 taken through line 2-2 in FIG. 1.
Figure 3:
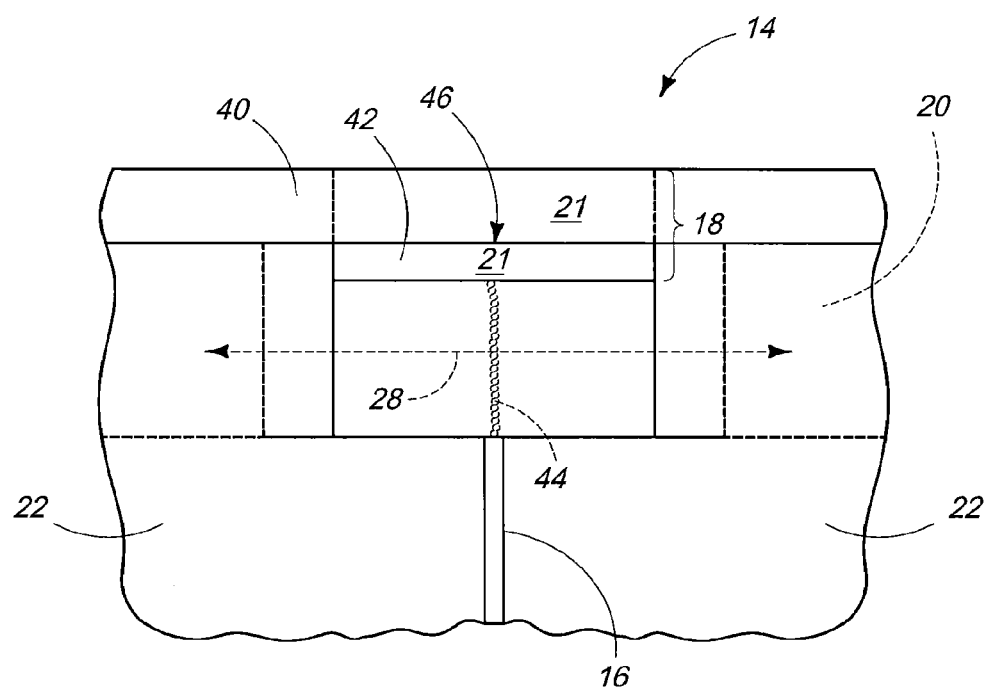
FIG. 3 is a sectional view of a portion of FIG. 1 taken through line 3-3 in FIG. 1.

FIGS. 2 and 3 diagrammatically depict memory cell 14 as being programmed in an example low resistance "1" state wherein a low electrical resistance/current conduction path 44 has been formed through ion conductive material 20. Conduction path 44 extends from and between surface 36 of first electrode 16 and sidewall 21 of current conductive material 42 where such are each received directly against ion conductive material 20. Conduction path 44 may be in the form of a path of current conductive particles which may or may not be directly against one another, with single ions and super-ionic clusters being examples. In some embodiments, the conduction path may be a filament, for example as described in U.S. Patent Publication No. 2010/01100759. Conduction path 44 may be formed by application of a suitable electric field through ion conductive material 20 to cause ions from the electrochemically active surface of one electrode to pass towards the opposing electrode and grow conduction path 44 through ion conductive material 20 from such opposing electrode. Such may be achieved by providing a suitable voltage differential to electrodes 16 and 18. Memory cell 14 may be programmed to an example high resistance "0" state by at least reversing polarity of the voltage differential to reverse the process, thereby removing conduction path 44. Memory cell 14 may thereby be repeatedly programmable between at least two programmed states by application of suitable voltage differentials to move between programmed states.

FIG. 1 depicts but one example architecture for array 12 of integrated circuit 10. In such, memory cell 14 is connected between or as portions of a schematically illustrated field effect transistor 100 and a schematically illustrated data/sense line 102 (i.e., a bit line). First electrode 16 is connected with or comprises one source/drain region of transistor 100, with the other source/drain region thereof connected to a suitable potential depicted as ground in FIG. 1, as an example. The gate of field effect transistor 100 may comprise a control line 104 (i.e., a word line) of a row line or column line of memory cells 14. Bit line 102 may comprise a corresponding other of a row line or column line of memory cells 14.

Some or all of second electrodes 18 in an individual data/sense line 102 may extend continuously along such data/sense line. As an example alternate embodiment, the architecture may be reversed. For example, some or all of first electrodes 16 may extend continuously along an individual control line, and individual second electrodes 18 may be isolated constructions relative one another along a corresponding data/sense line. Further and regardless, the roles of data/sense and control lines may be reversed.

An alternate embodiment nonvolatile memory cell 14a is shown in FIG. 5 in comparison to a single memory cell 14 in FIG. 1. Like numerals from the above-described memory cell 14 are used where appropriate, with some construction differences being indicated with the suffix "a". In memory cell 14a, second electrode 18a is received directly against elevationally outermost surface 48 of ion conductive material 20. Any other attribute as described above may apply to the nonvolatile memory cell construction 14a of FIG. 5. As an alternate example, in one embodiment, second electrode 18/18a might be oriented edgewise (not shown) such that it is oriented like first electrode 16, for example any of directly over and parallel thereto, not directly over and parallel thereto, and directly over or not directly over yet angled relative to first electrode 16.

Embodiments of the invention encompass methods of forming a nonvolatile memory cell. Example such methods are described with reference to FIGS. 6-10 with respect to a substrate fragment 60 in fabrication of a nonvolatile memory cell of the FIGS. 1-4 embodiments. The artisan will appreciate that the FIG. 5 or other nonvolatile memory cells may also or alternately be fabricated. Further and regardless, the fabrication methods disclosed herein are not necessarily limited by the structural aspects described above, nor are any structural aspects described above necessarily limited by methods of fabrication, unless so claimed.

Figure 6:
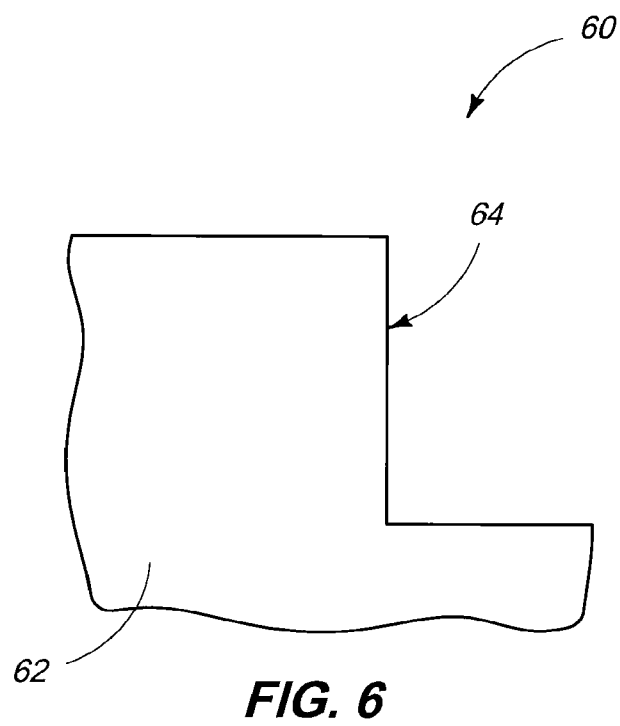
FIG. 6 is a diagrammatic sectional view of a substrate fragment in process in accordance with an embodiment of the invention.

Referring to FIG. 6, substrate 60 may comprise a semiconductor substrate, and is shown as comprising a material 62 having a first sidewall 64. Material 62 may be of any composition, may be homogenous or non-homogenous, and sidewall 64 may be vertically oriented. An example material 62 is some portion of material 22 of the above-described embodiments.

Figure 7:
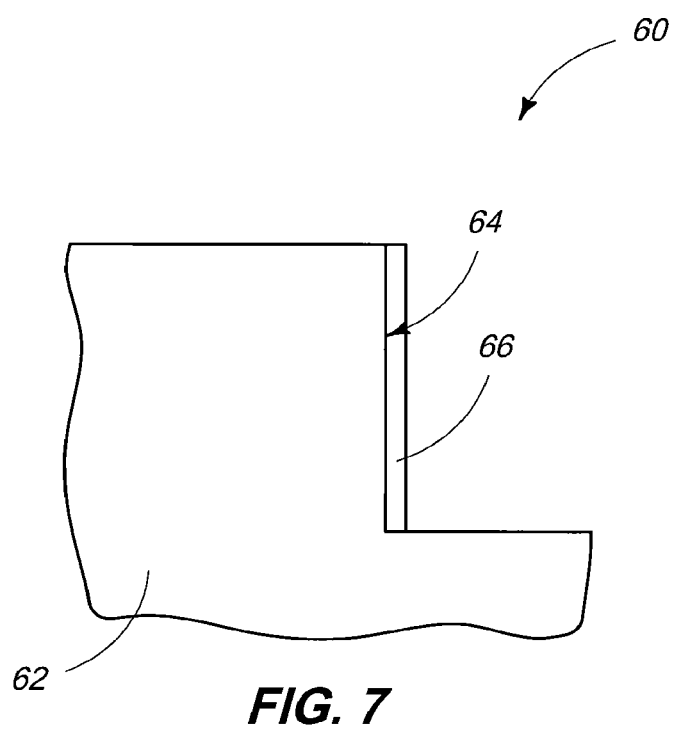
FIG. 7 is a view of the FIG. 6 substrate at a processing step subsequent to that shown by FIG. 6.

Referring to FIG. 7, a first current conductive electrode material 66 has been formed over first sidewall 64. In one embodiment, material 66 is formed to have a transverse thickness (thickness orthogonal to sidewall 64) which is less than F. An example technique for forming material 66 is by any suitable conformal deposition of material 66 over material 62, followed by anisotropic etching thereof to clear material 66 from the outer surfaces of material 62. Such may be conducted with or without masking. Regardless, alternate or additional techniques may be used. First current conductive electrode material 66 may have any of the attributes, including but not limited to "shape", of first electrode 16 described above. Accordingly, first current conductive electrode material 66 may be first electrode 16 of the FIGS. 1-4 embodiment.

Figure 8:
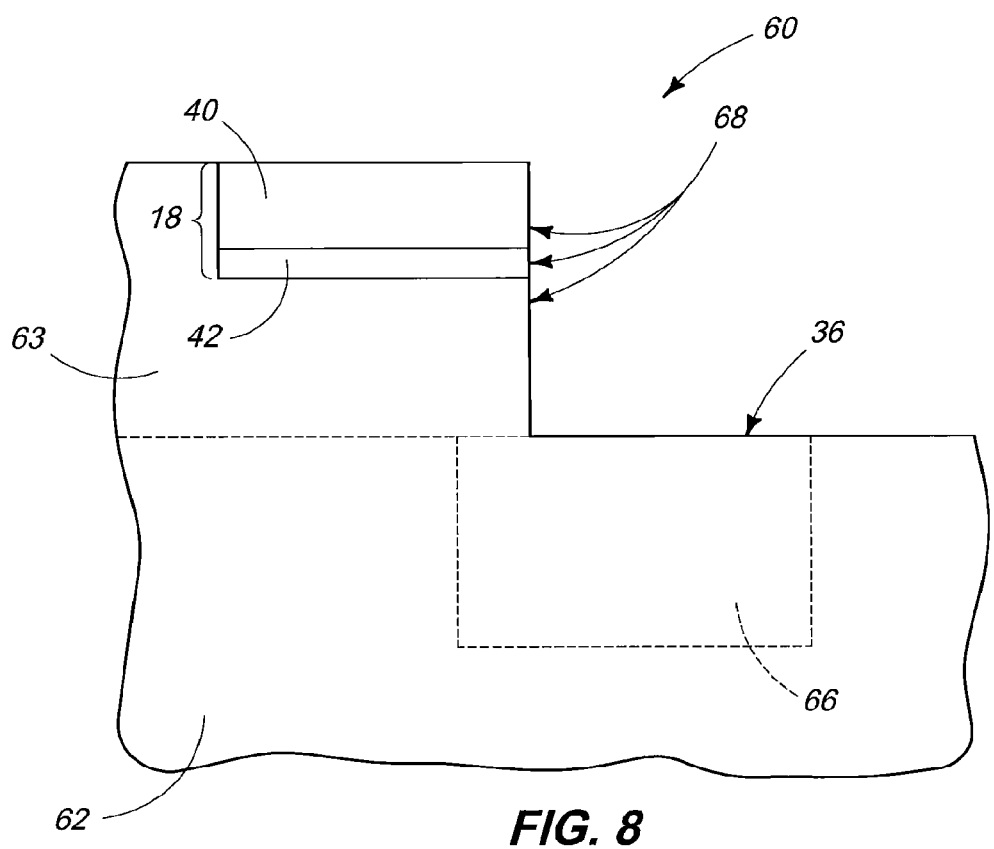
FIG. 8 is a view of the FIG. 7 substrate, at 90° to the FIG. 7 cross section, at a processing step subsequent to that shown by FIG. 7.
Figure 9:
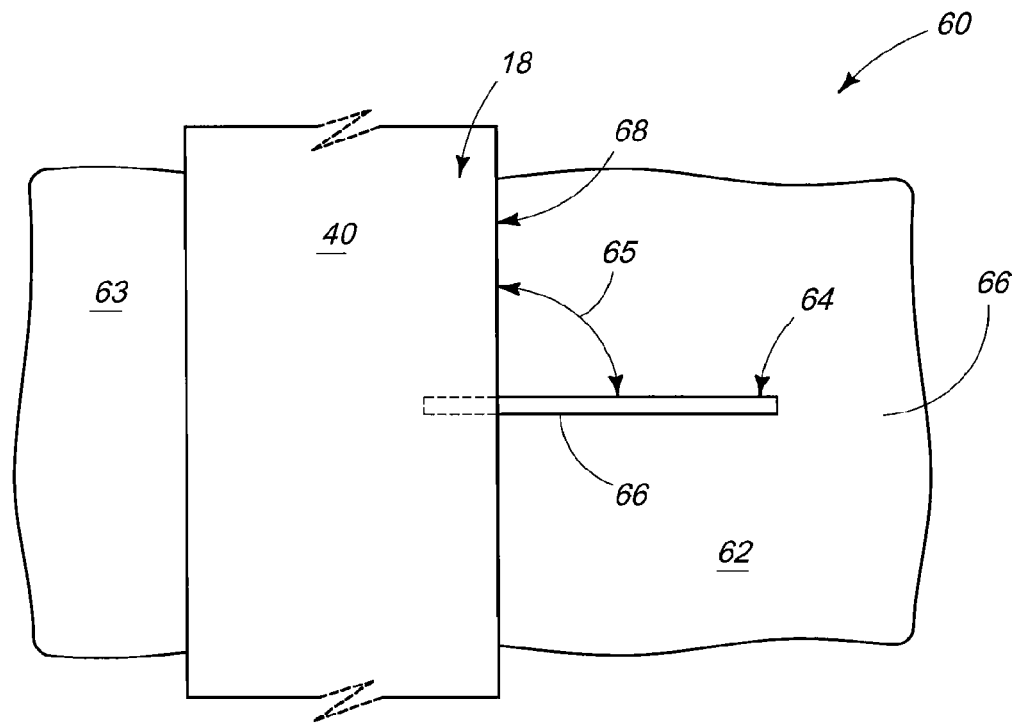
FIG. 9 is a diagrammatic top-down view of the FIG. 8 substrate.

Referring to FIGS. 8 and 9, a second sidewall 68 has been formed elevationally outward of first current conductive material 66, and first and second sidewalls 64, 68 have been formed at an angle 65 relative one another. In one embodiment, such angle is from about 45° to 90°, in one embodiment from 80° to 90°, and with an angle of 90° being shown. Sidewall 68 may be vertically oriented. In the embodiment of FIGS. 8 and 9, a material 63 has been formed over material 62 and first current conductive electrode material 66 and second current conductive electrode 18 have been provided relative thereto. Material 63 may be of the same composition as material 62. Materials 62 and 63 might be considered as a composite of material 22 of the embodiments of FIGS. 1-4.

Figure 10:
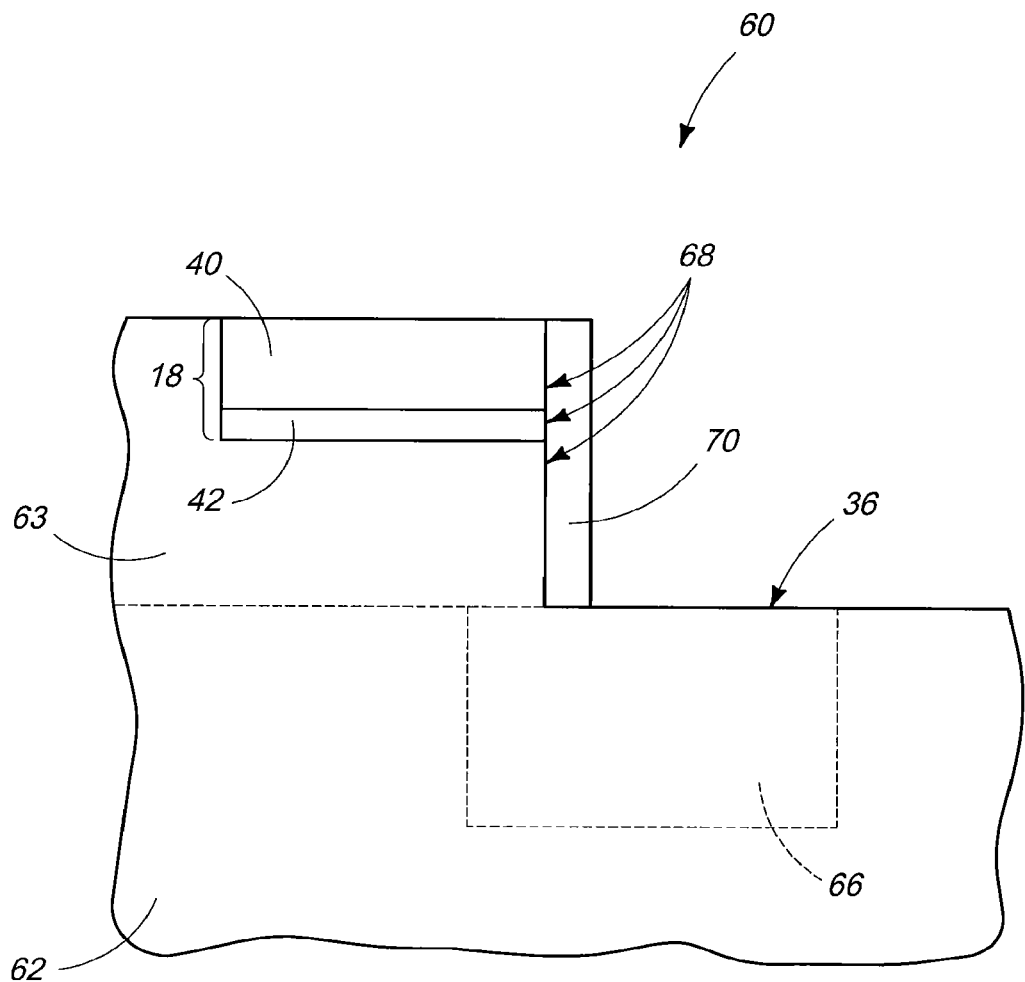
FIG. 10 is a view of the FIG. 8 substrate at a processing step subsequent to that shown by FIG. 8.

Referring to FIG. 10, an ion conductive material 70 has been formed over second sidewall 68 and directly against an elevationally outer surface 36 of first current conductive material 66. Example materials and attributes are as described above with respect to ion conductive material 20. Accordingly, ion conductive material 70 may be ion conductive material 20 in the first described embodiments. An example technique for forming ion conductive material 70 is by any suitable conformal deposition of material 70 over materials 40, 63, and 62, followed by anisotropic etching thereof to clear material 70 from the outer surfaces of materials 40, 63, and 62. Ion conductive material 70 and first current conductive material 66 contact one another at a maximum contacting area defined by a transverse thickness of the ion conductive material and a transverse thickness of the first current conductive electrode where such cross at their angle of intersection, for example analogous to and as depicted and described above with respect to FIG. 4.

Regardless, a second current conductive electrode is provided directly against the ion conductive material, with at least one of the first current conductive electrode and the second current conductive electrode having an electrochemically active surface directly against the ion conductive material. The second electrode may have any of the attributes as described above. Further, the ion conductive material may be formed before or after forming the second current conductive electrode. The FIGS. 6-10 embodiment is an example wherein the ion conductive material is formed after forming the second current conductive electrode. Alternately by way of example, FIG. 5 depicts an embodiment more conducive to forming the ion conductive material before forming the second current conductive electrode.

An embodiment of the invention includes a method of forming a nonvolatile memory cell comprising forming first and second electrodes where at least one of such has an electrochemically active surface, and independent of any other attribute described above (although such are example attributes which may be used in this embodiment). For example, such formation of first and second electrodes in accordance with this embodiment is independent of elevational or other orientation of the electrodes relative to each other. Regardless, after forming the first and second electrodes, an ion conductive material is deposited directly against the electrochemically active surface. Heretofore, the prior art is not understood to anywhere deposit an ion conductive material directly against an electrochemically active surface of a first and/or second electrode after both such electrodes have been formed.

In one embodiment, a dielectric may be provided between the first and second electrodes, and have a lateral sidewall. The ion conductive material may also be deposited directly against the dielectric lateral sidewall. For example with respect to FIG. 8 where material 63 comprises a dielectric, a portion of sidewall 68 (i.e., that which is below material 42) is a dielectric lateral sidewall directly against which ion conductive material 70 is deposited, for example as shown in FIG. 10. Any other attribute may be used as described above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuit comprising a nonvolatile memory cell, the nonvolatile memory cell comprising:
   a first platelike electrode, a second platelike electrode, and a platelike ion conductive material between the first and second platelike electrodes; at least one of the first and second platelike electrodes having an electrochemically active surface directly against the platelike ion conductive material; the second platelike electrode being elevationally outward of the first platelike electrode; each of the first platelike electrode, the second platelike electrode, and the platelike ion conductive material having a respective elongated thinnest edge; and
   the first platelike electrode extending laterally on its elongated thinnest edge and being elongated in a first direction along its elongated thinnest edge, the platelike ion conductive material extending laterally on its elongated thinnest edge and being elongated in a second direction along its elongated thinnest edge, the second direction being different from and intersecting the first direction, and the elongated thinnest edge of the first platelike electrode being directly against the elongated thinnest edge of the platelike ion conductive material only where the first and second directions intersect.

2. The integrated circuit of claim 1 wherein the platelike second electrode has an electrochemically active surface directly against the platelike ion conductive material.

3. The integrated circuit of claim 1 wherein the platelike first electrode has an electrochemically active surface directly against the platelike ion conductive material.

4. The integrated circuit of claim 1 wherein the platelike second electrode has a lateral outermost sidewall and the platelike ion conductive material has a transverse outermost sidewall directly against the platelike second electrode lateral outermost sidewall.

5. The integrated circuit of claim 4 wherein the lateral outermost sidewall and the transverse outermost sidewall are vertically oriented.

6. The integrated circuit of claim 1 wherein at least one of the platelike first electrode and the platelike ion conductive material has a thinnest transverse thickness where received directly against the other of the platelike first electrode or platelike ion conductive material which is less than F, where F is a minimum feature dimension of lithographically-defined features.

7. The integrated circuit of claim 1 wherein each of the platelike first electrode and the platelike ion conductive material has a thinnest transverse thickness where received directly against the other of the platelike first electrode or platelike ion conductive material which is less than F, where F is a minimum feature dimension of lithographically-defined features.

8. The integrated circuit of claim 1 wherein the first and second directions intersect at an angle from about 45° to 90°.

9. The integrated circuit of claim 8 wherein the first and second directions intersect at an angle from 80° to 90°.

10. The integrated circuit of claim 1 wherein the platelike first electrode and the platelike ion conductive material intersect at about 90.

11. The integrated circuit of claim 1 comprising a plurality of said nonvolatile memory cells within a memory array.

12. An integrated circuit comprising a nonvolatile memory cell, the nonvolatile memory cell comprising:
   a first platelike electrode, a second platelike electrode, and a platelike ion conductive material between the first and second platelike electrodes; at least one of the first and second platelike electrodes having an electrochemically active surface directly against the platelike ion conductive material; the second platelike electrode being elevationally outward of the first platelike electrode; each of the first platelike electrode, the second platelike electrode, and the platelike ion conductive material having a respective elongated thinnest edge;
   each of the first platelike electrode, the second platelike electrode, and the platelike ion conductive material being oriented perpendicularly relative each other; and
   the first platelike electrode extending laterally on its elongated thinnest edge and being elongated in a first direction along its elongated thinnest edge, the platelike ion conductive material extending laterally on its elongated thinnest edge and being elongated in a second direction along its elongated thinnest edge, the second direction being different from and intersecting the first direction, and the elongated thinnest edge of the first platelike electrode being directly against the elongated thinnest edge of the platelike ion conductive material only where the first and second directions intersect.

13. The integrated circuit of claim 12 wherein the second platelike electrode comprises an electrochemically active surface directly against the platelike ion conductive material.

14. The integrated circuit of claim 12 wherein the second platelike electrode comprises an electrochemically active material having an electrochemically active surface directly against the platelike ion conductive material, the electrochemically active material of the second platelike electrode having an elevationally outermost surface that is not received against the platelike ion conductive material.

15. The integrated circuit of claim 14 wherein the ion conductive material has an elevationally outermost surface which is elevationally outward of the elevationally outermost surface of the electrochemically active material of the second platelike electrode.

16. The integrated circuit of claim 12 wherein each of the first platelike electrode and platelike ion conductive material is of a respective uniform transverse thickness.

17. The integrated circuit of claim 12 wherein each of the first platelike electrode and the platelike ion conductive material are of a respective uniform transverse thickness which is less than F, where F is a minimum feature dimension of lithographically-defined features.

18. An integrated circuit comprising a nonvolatile memory cell, the nonvolatile memory cell comprising:
   a first platelike electrode, a second electrode, and a platelike ion conductive material between the first and second electrodes; the second electrode having an electrochemically active surface directly against the platelike ion conductive material and an electrochemically inactive surface directly against the platelike ion conductive material; the second electrode being elevationally outward of the first platelike electrode; each of the first platelike electrode, the second platelike electrode, and the platelike ion conductive material having a respective elongated thinnest edge; and
   the first platelike electrode extending laterally on its elongated thinnest edge and being elongated in a first direction along its elongated thinnest edge, the platelike ion conductive material extending laterally on its elongated thinnest edge and being elongated in a second direction along its elongated thinnest edge, the second direction being different from and intersecting the first direction, and the elongated thinnest edge of the first platelike electrode being directly against the and the elongated thinnest edge of platelike ion conductive material only where the first and second directions intersect; and
   the second electrode having a lateral outermost sidewall and the platelike ion conductive material having a transverse outermost sidewall directly against the second electrode lateral outermost sidewall, and the second electrode only being directly against the platelike ion conductive material at the transverse outermost sidewall of the platelike ion conductive material.

19. The integrated circuit of claim 18 wherein,
   the second electrode comprises an elevationally outer conductive material that is directly against the transverse outermost sidewall of the platelike ion conductive material;
   the second electrode comprises an elevationally inner conductive material having an electrochemically active surface that is directly against the transverse outermost sidewall of the platelike ion conductive material; and
   the elevationally outer conductive material being elevationally thicker than the elevationally inner conductive material.

* * * * *

UNITED STATES PATENT AND TRADEMARK OFFICE
CERTIFICATE OF CORRECTION

PATENT NO. : 9,705,078 B2  
APPLICATION NO. : 14/981198  
DATED : July 11, 2017  
INVENTOR(S) : Jun Liu and John K. Zahurak It is certified that error appears in the above-identified patent and that said Letters Patent is hereby corrected as shown below:

In the Claims

Column 10, Line 52, Claim 19, please delete "claim 18" after "circuit of" and insert --claim 12--.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*